(12) United States Patent
Kieft et al.

(10) Patent No.: US 10,340,113 B2
(45) Date of Patent: Jul. 2, 2019

(54) STUDYING DYNAMIC SPECIMEN BEHAVIOR IN A CHARGED-PARTICLE MICROSCOPE

(71) Applicant: FEI Company, Hillbsoro, OR (US)

(72) Inventors: Erik René Kieft, Eindhoven (NL); Walter van Dijk, Geldrop (NL)

(73) Assignee: FEI Company, Hillsboro, OR (US)

( * ) Notice: Subject to any disclaimer, the term of this patent is extended or adjusted under 35 U.S.C. 154(b) by 333 days.

(21) Appl. No.: 15/389,151

(22) Filed: Dec. 22, 2016

(65) Prior Publication Data

US 2017/0243713 A1 Aug. 24, 2017

(30) Foreign Application Priority Data

Feb. 24, 2016 (EP) .................................... 16157199

(51) Int. Cl.
*H01J 37/04* (2006.01)
*H01J 37/147* (2006.01)
(Continued)

(52) U.S. Cl.
CPC .......... *H01J 37/045* (2013.01); *H01J 37/147* (2013.01); *H01J 37/1474* (2013.01); *H01J 37/20* (2013.01);
(Continued)

(58) Field of Classification Search
CPC ...... H01J 37/1474; H01J 37/20; H01J 37/244; H01J 37/28; H01J 37/147; H01J 37/243;
(Continued)

(56) References Cited

U.S. PATENT DOCUMENTS

| 4,445,041 A * | 4/1984 | Kelly .................... H01J 37/045 250/396 R |
| 6,414,313 B1 * | 7/2002 | Gordon .................. B82Y 10/00 250/350 |

(Continued)

FOREIGN PATENT DOCUMENTS

| CN | 1393691 A | 1/2003 |
| EP | 2722865 A1 | 4/2014 |

(Continued)

OTHER PUBLICATIONS

"Electron Microscope", Wikipedia, Retrieved from the Internet Oct. 15, 2015, http://en.wikipedia.org/wiki/Electron_microscope, 11 pages.
(Continued)

*Primary Examiner* — Wyatt A Stoffa (57) ABSTRACT

A method of using a Charged Particle Microscope, comprising:
  A specimen holder, for holding a specimen;
  A source, for producing an irradiating beam of charged particles;
  An illuminator, for directing said beam so as to irradiate the specimen;
  A detector, for detecting a flux of emergent radiation emanating from the specimen in response to said irradiation,
additionally comprising the following steps:
  In said illuminator, providing an aperture plate comprising an array of apertures;
  Using a deflecting device to scan said beam across said array, thereby alternatingly interrupting and transmitting the beam so as to produce a train of beam pulses;
(Continued)

Irradiating said specimen with said train of pulses, and using said detector to perform positionally resolved (temporally discriminated) detection of the attendant emergent radiation.

20 Claims, 3 Drawing Sheets (51) Int. Cl.
*H01J 37/244* (2006.01)
*H01J 37/28* (2006.01)
*H01J 37/20* (2006.01)

(52) U.S. Cl.
CPC ............ *H01J 37/244* (2013.01); *H01J 37/28* (2013.01); *H01J 2237/0432* (2013.01); *H01J 2237/0435* (2013.01); *H01J 2237/1504* (2013.01); *H01J 2237/2446* (2013.01); *H01J 2237/24495* (2013.01); *H01J 2237/24585* (2013.01); *H01J 2237/2802* (2013.01)

(58) Field of Classification Search
CPC .. H01J 37/045; H01J 37/09; H01J 2237/0435; H01J 2237/0432; H01J 2237/1504; H01J 2237/2446; H01J 2237/24495; H01J 2237/24585
See application file for complete search history.

(56) References Cited

U.S. PATENT DOCUMENTS

| | | | | |
|---|---|---|---|---|
| 7,557,360 | B2* | 7/2009 | Ward | B82Y 10/00 |
| | | | | 250/423 F |
| 8,569,712 | B2 | 10/2013 | Knippels et al. | |
| 10,032,599 | B2* | 7/2018 | Kieft | H01J 37/045 |
| 2012/0261586 | A1* | 10/2012 | Knippels | H01J 37/045 |
| | | | | 250/396 R |
| 2014/0097342 | A1* | 4/2014 | Tsuno | H01J 37/28 |
| | | | | 250/307 |
| 2014/0103225 | A1 | 4/2014 | Kieft et al. | |
| 2015/0235800 | A1 | 8/2015 | Reed et al. | |
| 2016/0005566 | A1* | 1/2016 | Zewail | H01J 37/26 |
| | | | | 250/307 |
| 2016/0293377 | A1* | 10/2016 | Baryshev | H01J 37/06 |

FOREIGN PATENT DOCUMENTS

| | | |
|---|---|---|
| JP | S49021829 | 2/1974 |
| JP | S49037759 | 4/1974 |
| JP | S60130031 A | 7/1985 |
| JP | 2006196236 A | 7/2006 |
| WO | 2014123591 | 8/2014 |

OTHER PUBLICATIONS

"Focused Ion Beam", Wikipedia, Retrieved from the Internet Jul. 11, 2016, https://en.wikipedia.org/wiki/Focused_ion_beam, 7 pages.
"Microwave Cavity," Wikipedia, Retrieved from the Internet Mar. 26, 2017, https://en.wikipedia.org/wiki/Microwave_cavity.
"Scanning Electron Microscope", Wikipedia. Retrieved from the Internet Jul. 25, 2016, http://en.wikipedia.org/wiki/Scanning_electron_microscope, 23 pages.
"Scanning Helium Ion Microscope", Wikipedia, Retrieved from the Internet on Jul. 25, 2016, http://en.wikipedia.org/wiki/Scanning_Helium_Ion_Microscope, 2 pages.
"Scanning Transmission Electron Microscopy", Wikipedia, Retrieved from the Internet Jul. 25, 2016, http://en.wikipedia.org/wiki/Scanning_transmission_electron_microscopy, 5 pages.
"Transmission Electron Microscopy", Wikipedia, Retrieved from the Internet Jul. 25, 2016, http://en.wikipedia.org/wiki/Transmission_electron_microscopy, 23 pages.
Escovitz, W.H. et al., "Scanning Transmission Ion Microscope with a Field Ion Source," Proc. Nat. Acad. Sci. USA, May 1975, pp. 1826-1828, vol. 72, No. 5.
Thong, J.T.L, et al., "Ultrahigh speed electron beam puls-ing systems for electron beam testing," Optomechatronic Micro/Nano Devices and Components III: Oct. 8-10, 2007 Lusanne, Switzerland [Proceedings of SPIE (1987), pp. 178-187, Bellingham, WA].
Varentsov, D. et al. "First biological images with high-energy proton microscopy", Physica Medica (2013), pp. 208-213, vol. 29.

* cited by examiner

STUDYING DYNAMIC SPECIMEN BEHAVIOR IN A CHARGED-PARTICLE MICROSCOPE

The invention relates to a method of using a Charged Particle Microscope, comprising:
- A specimen holder, for holding a specimen;
- A source, for producing an irradiating beam of charged particles;
- An illuminator, for directing said beam so as to irradiate the specimen;
- A detector, for detecting a flux of emergent radiation emanating from the specimen in response to said irradiation.

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various subspecies, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:
- In a SEM, irradiation of a specimen by a scanning electron beam precipitates emanation of "auxiliary" radiation from the specimen, in the form of secondary electrons, backscattered electrons, X-rays and photoluminescence (infrared, visible and/or ultraviolet photons), for example; one or more components of this emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

More information on some of the topics elucidated here can, for example, be gleaned from the following Wikipedia links:
en.wikipedia.org/wiki/Electron_microscope
en.wikipedia.org/wiki/Scanning_electron_microscope
en.wikipedia.org/wiki/Transmission_electron_microscopy
en.wikipedia.org/wiki/Scanning_transmission_electron_microscopy As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance. As regards non-electron-based charged particle microscopy, some further information can, for example, be gleaned from references such as the following:
en.wikipedia.org/wiki/Focused_ion_beam
en.wikipedia.org/wiki/Scanning_Helium_Ion_Microscope
W. H. Escovitz, T. R. Fox and R. Levi-Setti, *Scanning Transmission Ion Microscope with a Field Ion Source*, Proc. Nat. Acad. Sci. USA 72(5), pp 1826-1828 (1975).
www.ncbi.nlm.nih.gov/pubmed/22472444

It should be noted that, in addition to imaging and performing (localized) surface modification (e.g. milling, etching, deposition, etc.), a charged particle microscope may also have other functionalities, such as performing spectroscopy, examining diffractograms, etc.

In all cases, a Charged Particle Microscope (CPM) will comprise at least the following components:
- A radiation source, such as a Schottky electron source or ion gun.
- An illuminator, which serves to manipulate a "raw" radiation beam from the source and perform upon it certain operations such as focusing, aberration mitigation, cropping (with an aperture), filtering, etc. It will generally comprise one or more (charged-particle) lenses, and may comprise other types of (particle-) optical component also. If desired, the illuminator can be provided with a deflector system that can be invoked to cause its exit beam to perform a scanning motion across the specimen being investigated.
- A specimen holder, on which a specimen under investigation can be held and positioned (e.g. tilted, rotated). If desired, this holder can be moved so as to effect scanning motion of the beam w.r.t. the specimen. In general, such a specimen holder will be connected to a positioning system such as a mechanical stage.
- A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations.

In the case of a transmission-type microscope (such as a (S)TEM, for example), the CPM will also comprise:
- An imaging system, which essentially takes charged particles that are transmitted through a specimen (plane) and directs (focuses) them onto analysis apparatus, such as a detection/imaging device, spectroscopic apparatus (such as an EELS device), etc. As with the illuminator referred to above, the imaging system may also perform other functions, such as aberration mitigation, cropping, filtering, etc., and it will generally comprise one or more charged-particle lenses and/or other types of particle-optical components.

In what follows, the invention may—by way of example—sometimes be set forth in the specific context of electron microscopy; however, such simplification is intended solely for clarity/illustrative purposes, and should not be interpreted as limiting.

Conventionally, investigations employing a CPM involve the study of "static" specimens; in such situations, the imaging beam of charged particles will also be static (continuous) in nature. However, there are certain categories of "dynamic" specimen that cannot be satisfactorily studied in the conventional manner. Specimens in this latter category demonstrate (physical and/or chemical) characteristics that (rapidly) change as a function of time, and such characteristics cannot be adequately revealed using a static beam. An analogy can be made here to photography, where an extended exposure is perfectly suitable for capturing a static scene (such as in astronomy), but is intrinsically unsuited to capturing a dynamic scene (such as a high-speed impact, for example); in this latter case, one will have to resort to using a short shutter time and/or a short flash duration (as in the case of stroboscopic photography). In the case of CPM studies, "dynamic" specimens as referred to here are not necessarily moving; more generically formulated, they are "evolving", e.g. in the sense that they are undergoing a rapid phase transition, chemical reaction, transmutation, etc. In order to follow such changes, it is generally not necessary to form an image of the specimen; instead, in many cases, more useful information can be gleaned from a diffractogram, spectrum, etc., which intrinsically lend themselves to tracking compositional change. In this regard, CPMs are highly versatile tools, because they have imaging, diffractometric and spectroscopic functionality; however, to date, they do not offer many (satisfactory) ways of analyzing dynamic specimens, particularly on extremely short (e.g. picosecond) timescales.

It is an object of the invention to address this problem. In particular, it is an object of the invention to provide an innovative method of using a CPM that lends itself to investigating dynamic specimen behavior.

These and other objects are achieved in a method as set forth in the opening paragraph above, characterized by the following steps:
In the CPM's illuminator, providing an aperture plate comprising an array of apertures;
Using a deflecting device to scan said beam across said array, thereby alternatingly interrupting and transmitting the beam so as to produce a train of beam pulses;
Irradiating said specimen with said train of pulses, and using said detector to perform positionally resolved detection of the attendant emergent radiation.

The temporal separation of the beam pulses produced in this manner will depend on the speed at which the beam is scanned across the aperture array and/or on the mutual spacing of successive apertures in the array (which need not necessarily be regular). The pulse width of individual pulses in the generated pulse train will depend on the width/form of individual apertures in the array and/or on the scanning speed of the beam. Because (at least a component of) the array length extends in a lateral direction (within an XY plane) normal to the longitudinal (Z axis) propagation direction of the beam, the pulse train will also be (at least partially) distributed in this lateral direction—as a result of which individual pulses in the train will (ultimately) strike the employed detector at different lateral positions. In this way, (a portion of) an image, diffractogram, spectrum, etc., [hereafter referred to as a "detection entity"] produced (after interaction with a specimen) by a pulse of ordinal n will—on an XY detection plane of the detector—be spatially displaced relative to that produced by a (preceding) pulse of ordinal n−1 and/or a (subsequent) pulse of ordinal n+1; consequently, the train of pulses will produce a corresponding set of mutually spatially displaced (positionally resolved, temporally discriminated) detection entities on the detector, which conveniently allows evolutionary processes in the specimen to be tracked. For example, if a crystalline structure of the specimen evolves from (say) hexagonal to cubic as a result of a phase transition, this will clearly manifest itself in a set of mutually spatially displaced diffractogram patterns recorded using the pulse train of the present invention.

It should be noted that, if desired/required, an external stimulus can be applied to the specimen while (and/or just before) it is being irradiated with the inventive pulse train. Such a stimulus might, for example, comprise application of an electrical signal, irradiation with a photon (or other particle) beam, administration of a chemical reagent, etc. This may, for example, be done so as to precipitate and/or influence particular dynamic behavior in the specimen.

In a particular embodiment of the invention, the employed deflecting device comprises a resonant RF (radio frequency) cavity through which the beam passes. Some general information on RF resonant cavities can, for example, be gleaned from the following reference:
en.wikipedia.org/wiki/Microwave_cavity
A resonant cavity is a relatively compact means of performing beam deflection—which is of considerable advantage in the generally cramped volume around the beam in a CPM. Moreover, it can achieve very high resonant frequencies—allowing beam deflection periods in the picosecond/femtosecond range to be relatively easily achieved; this is an important advantage when one wishes to use the current invention to observe ultra-rapid dynamic specimen behavior. Another advantage of a cavity resonator is that it intrinsically has a low/zero leakage field. The deflecting device used by the present invention can, however, be embodied in other ways, e.g. as a more conventional electrostatic or magnetic deflector; such a deflector can, if desired, be driven by a high-speed resonant circuit, with the aim of achieving higher deflection frequencies.

In a specific embodiment of the invention, a resonant cavity as set forth in the previous paragraph is excited (operated, driven) in $TM_{110}$ mode. According to standard usage in the field of electromagnetism, the symbol "TM" indicates a Transverse Magnetic field, i.e. an electromagnetic field that has no longitudinal magnetic component (so that B=0 along the aforementioned Z axis). The triplet of subscripts "110" denotes integer eigenvalues of a wave vector k needed to satisfy boundary conditions pertaining to Maxwell's equations in the cavity. Without going into further mathematical detail, a $TM_{110}$ mode is a dipole mode with a strong lateral magnetic field at radius r=0 (measured outward from the Z axis) and zero electric field at r=0. Such a mode can, for example, be excited in the cavity with the aid of a Hertzian dipole loop antenna placed close to the wall of the cavity (distal from the Z axis). An antenna of this type can, for example, be achieved by:
Creating a small bore in a wall of the cavity;
Feeding the inner conductor of a coaxial cable through this bore to the interior of the cavity, in such a way that said inner conductor does not touch said (conducting) wall;
Creating a loop in said inner conductor proximal to said wall;
Orienting the loop appropriately (e.g. so that its plane is normal to the Y axis, to excite a magnetic field parallel to Y);
Connecting said coaxial cable to an oscillating Radio Frequency power supply. The vibrational behavior of the cavity can be adjusted in various ways. For example, the frequency of said oscillating power supply can be altered. Alternatively, a small conducting (e.g. metallic) or dielectric "plunger" (tuning element) can be partially inserted into the cavity, e.g. through a small bore opposite the above-mentioned antenna; the extent of insertion of such a plunger will then influence the resonant frequency of the cavity, because:
Insertion of a conducting plunger will locally decrease the effective radius of the cavity, with an attendant increase in resonant frequency;
Insertion of a dielectric plunger will increase the effective dielectric constant of the cavity, with an attendant decrease in resonant frequency.

Needless to say, when the cavity is excited on-resonance (i.e. the frequency of the oscillating power supply is matched to the resonant frequency of the cavity), the resulting electromagnetic fields in the cavity will be at their largest. The skilled artisan in the field of electromagnetism will be familiar with such concepts, and will be able to implement and optimize them according to the details/requirements of a particular configuration. In particular, he will realize that other types and/or locations of antenna (or other means of excitation) can be employed, as well as other types and/or locations of tuning element/plunger. He will also understand that he is not limited per se to a $TM_{110}$ resonance mode, and that, in principle, other types of TM, TE (Transverse Electric) and/or Transverse Electro-Magnetic modes may be equally or better suited to a given set-up.

In a particular embodiment of the present invention, the beam upstream of/entering the deflecting device (the "entrant beam") is pulsed. Pulsing the entrant beam in this manner has a number of advantages. For example, if the employed deflecting device has a "characteristic frequency" of deflection (as in the case of the resonance frequency of an RF resonant cavity), then using a pulsed entrant beam allows the ultimate (effective) deflection frequency of the beam leaving the deflecting device (the "emergent beam") to be adjusted (reduced). In certain cases, this effect can be understood in terms of the superposition of two signals of different frequency—which produces so-called "beats" at a frequency lower than the frequency of either of the superimposed beams; more generally, however, the entrant beam can be pulsed at the desired frequency of the emergent beam, and synchronized (phase-locked) to the driving (RF) frequency used to excite the deflecting device. In a particular example, if said characteristic frequency is considered to be undesirably high for a given application (e.g. $\sim 3 \times 10^9$ Hz, as produced by a given RF cavity configuration), then the present embodiment allows a lower (ultimate) deflection frequency to be selected, if desired (e.g. $\sim 10^6$-$10^4$ Hz). Another advantage of the present embodiment is that a pulsed entrant beam can typically have a larger instantaneous beam current than a continuous entrant beam, resulting in more charged particles (on average) in each of the pulses of the pulse train, with an attendant increase in signal-to-noise ratio. A pulsed entrant beam as referred to here can, for example, be realized by using a pulsed laser to excite/trigger/modulate a photoelectric source [or to modulate the thermal excitation of a thermal source (such as an $LaB_6$ (hot cathode) crystal) or a thermionic source (such as a Schottky emitter), for instance]. Alternatively, an oscillatory beam blanker/chopper can be used somewhere between the source and deflecting device.

It should be noted that, instead of pulsing the entrant beam as described in the previous paragraph, one could alternatively (or supplementally) modify the (ultimate) frequency of the emergent beam using an oscillating beam blanker downstream of the deflecting device.

In advantageous embodiments of the invention:
(I) A plane of the deflecting device is imaged (or approximately imaged) onto a plane of the specimen; and optionally
(II) The employed aperture plate is located at (or near) an intermediate beam/ray crossover point (of the nominal/non-deflected emergent beam).

Put another way: the deflecting device and specimen are located on (or proximal to) conjugate planes, with (optionally) the aperture plate disposed at (or proximal to) an intermediate (converging-to-diverging) inflection plane.

Figure 2:
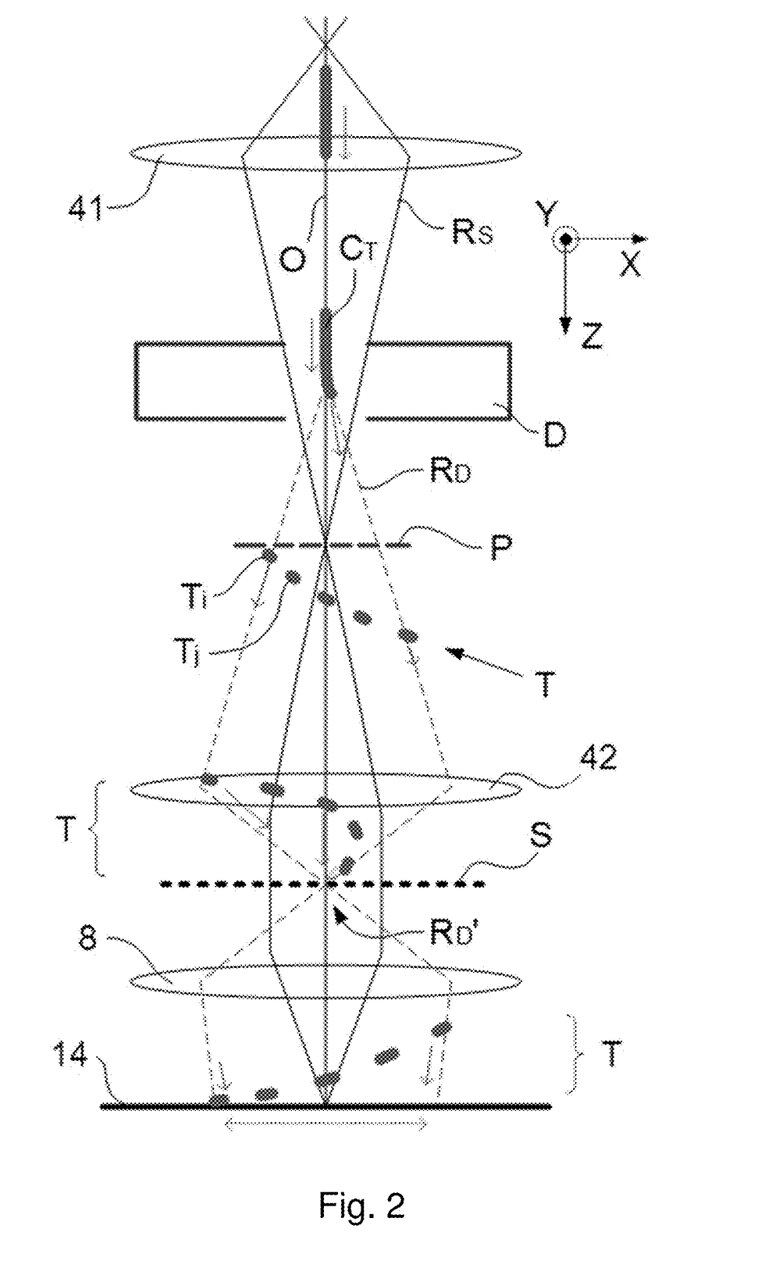
FIG. 2 shows a more detailed view of part of the set-up of FIG. 1.

Such a set-up is illustrated in FIG. 2, for example, and is advantageous inter alia for the following reasons:
(i) If a plane of the deflecting device is imaged onto the specimen plane, then the different pulses in the pulse train will (exactly) spatially overlap in the specimen plane. As a result, after interaction with the specimen, each pulse in the train will carry information about (essentially) the same part of the specimen—which can be advantageous vis-à-vis interpretation/correlation of the detected results.
(ii) If the aperture plate is located at a beam crossover, then this will result in the sharpest rise and fall times of the individual pulses—and hence the best time resolution for a given deflection speed. Also, given constraint (i) above, if the aperture sizes (in the aperture array) are matched to the width of the crossover (beam waist), then this configuration will lead to the least growth of emittance in the pulse (i.e. least loss of lateral pulse coherence); in other words, placing the aperture plate at this position will allow the different pulses in the pulse train to be imaged as sharp spots on the detector. Moreover, if the viewed detection entity is a diffraction pattern, then constraint (ii) will keep the separation of successive pulses in the pulse train—as captured by the detector—relatively small compared to the separation of different diffraction peaks in a typical diffractogram.

As regards (I)/(i) above, it should be noted that one way of associating a "plane" with the deflecting device is to trace back the trajectories of the various pulses emerging therefrom—which (at least by approximation) will converge at a single point, whose position along the optical axis defines the position of said "plane". Typically (though not necessarily) said point will be at/near the geometric center (barycenter) of the deflecting device.

The skilled artisan is free to embody the aperture plate of the present invention in various different ways. For example, the array of apertures in the plate can extend in a straight line, but may alternatively lie along a curved line, if desired. Also, a given plate may contain several different aperture arrays, e.g. with different array pitches and/or different aperture sizes/shapes and/or extending in different directions. As already stated above, the separation of neighboring apertures in an array does not have to be constant, and may instead vary, if desired (e.g. to compensate for higher-order effects associated with the beam deflection across the array). The shape/size of the apertures is also a matter of choice, whereby it deserves mention that the shape/size of an aperture parallel to the direction of beam deflection/scan is generally more important than the shape/size of that aperture perpendicular to said direction; so, for example, the apertures could be round, or slit-shaped, as desired. In many applications, the apertures will have a width (parallel to the beam deflection/scan direction) in the range 0.5-20 µm, and a mutual separation (in the same direction) in the range 10-200 µm, although such values are, of course, non-limiting.

In many typical (non-limiting) applications of the invention, the following values may be used as guidance parameters for the pulsed beam striking the specimen:
Pulse length: ~100 femtoseconds-1 picosecond, though shorter (e.g. ~1 fs) or longer (e.g. ~1 ns) values are, of course, also possible;
Pulse separation: ~10 times the employed pulse length, though other values are, of course, possible.

The invention will now be elucidated in more detail on the basis of exemplary embodiments and the accompanying schematic drawings, in which.

In the Figures, where pertinent, corresponding parts may be indicated using corresponding reference symbols.

EMBODIMENT 1

Figure 1:
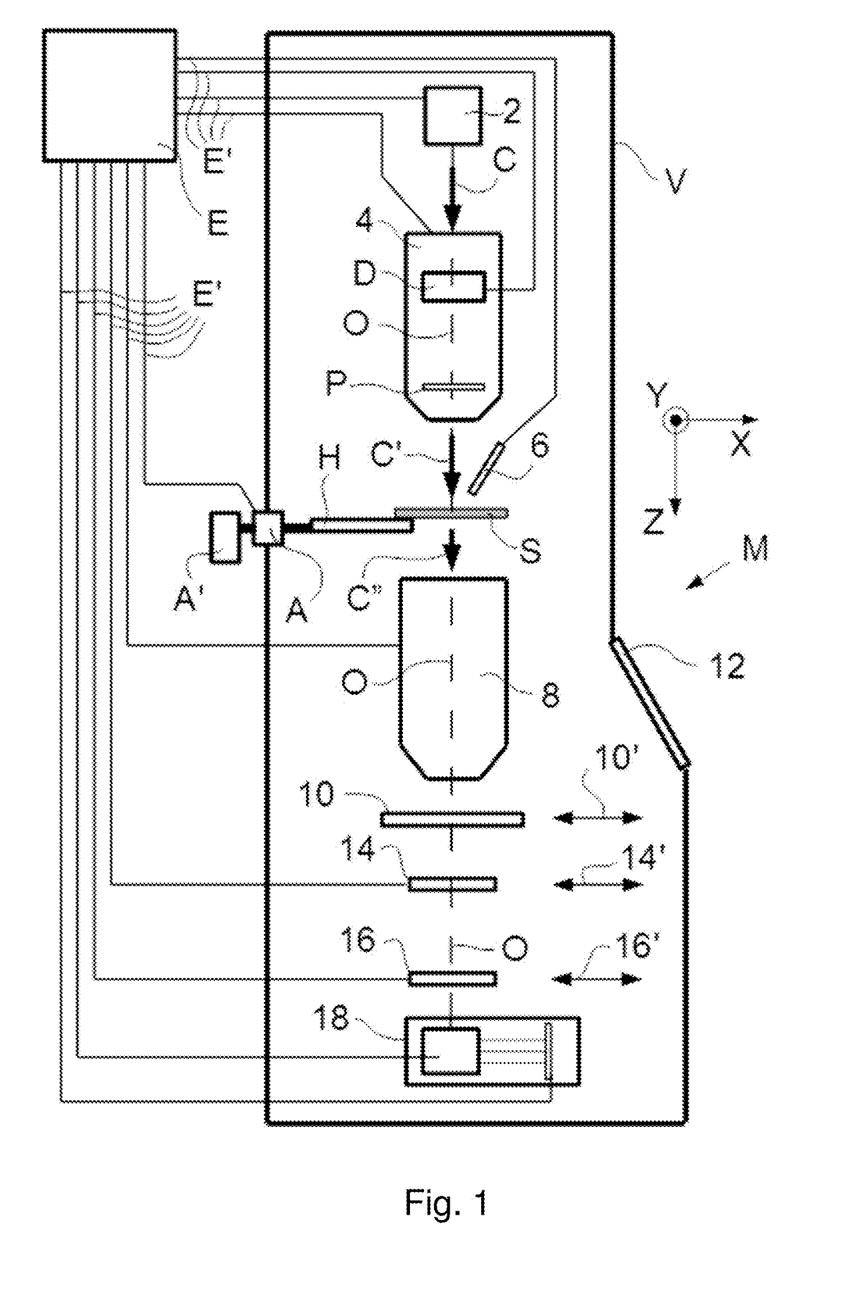
FIG. 1 renders a longitudinal cross-sectional view of a CPM in which an embodiment of the present invention is implemented.

FIG. 1 is a highly schematic depiction of an embodiment of a CPM in which the present invention is implemented; more specifically, it shows an embodiment of a transmission-type microscope M, which, in this case, is a TEM/STEM (though, in the context of the current invention, it could just as validly be an ion-based microscope, for example). In the Figure, within a vacuum enclosure V, an electron source 2 (such as a Schottky emitter, for example) produces a beam (C/C') of electrons that traverse an electron-optical illuminator 4, serving to direct/focus them onto a chosen part of a specimen S (which may, for example, be (locally) thinned/planarized). This illuminator 4 has an electron-optical axis O, and will generally comprise a variety of electrostatic/magnetic lenses, (scan) deflector(s), correctors (such as stigmators), etc.; typically, it can also comprise a condenser system (the whole of item 4 is sometimes referred to as "a condenser system").

The specimen S is held on a specimen holder H that can be positioned in multiple degrees of freedom by a positioning system/stage A; for example, the specimen holder H may comprise a finger that can be moved (inter alia) in the XY plane (see the depicted Cartesian coordinate system; typically, motion parallel to Z and (at least) tilt about X/Y will also be possible). Such movement allows different parts of the specimen S to be irradiated/imaged/inspected by the electron beam traveling along axis O (in the Z direction) (and/or allows scanning motion to be performed, as an alternative to beam scanning). If required, a cooling device A' can be placed in intimate thermal contact with the specimen holder H, so as to maintain the latter at cryogenic temperatures, e.g. using a vat of cryogenic coolant to achieve and maintain a desired low temperature.

The (focused) electron beam C' traveling along axis O will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 6, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen S, emerge (emanate) from it and continue to propagate (substantially, though generally with some deflection/scattering) along axis O. Such a transmitted electron flux enters an imaging system (combined objective/projection lens) 8, which will generally comprise a variety of electrostatic/magnetic lenses, deflectors, correctors (such as stigmators), etc. In normal (non-scanning) TEM mode, this imaging system 8 can focus the transmitted electron flux onto a fluorescent screen 10, which, if desired, can be retracted/withdrawn (as schematically indicated by arrows 10') so as to get it out of the way of axis O. An image (or diffractogram) of (part of) the specimen S will be formed by imaging system 8 on screen 10, and this may be viewed through viewing port 12 located in a suitable part of a wall of enclosure V. The retraction mechanism for screen 10 may, for example, be mechanical and/or electrical in nature, and is not depicted here.

As an alternative to viewing an image on screen 10, one can instead make use of the fact that the depth of focus of the electron flux emerging from imaging system 8 is generally quite large (e.g. of the order of 1 meter). Consequently, various other types of analysis apparatus can be used downstream of screen 10, such as:

TEM camera 14. At camera 14, the electron flux can form a static image (or diffractogram) that can be processed by controller E and displayed on a display device (not depicted), such as a flat panel display, for example. When not required, camera 14 can be retracted/withdrawn (as schematically indicated by arrows 14') so as to get it out of the way of axis O.

STEM imager (camera) 16. An output from imager 16 can be recorded as a function of (X,Y) scanning position of the beam C' on the specimen S, and an image can be constructed that is a "map" of output from imager 16 as a function of X,Y. Imager 16 can, for example, comprise a single pixel with a diameter of e.g. 20 mm, as opposed to the matrix of pixels characteristically present in camera 14. Moreover, imager 16 will generally have a much higher acquisition rate (e.g. $10^6$ points per second) than camera 14 (e.g. $10^2$ images per second). Once again, when not required, imager 16 can be retracted/withdrawn (as schematically indicated by arrows 16') so as to get it out of the way of axis O (although such retraction would not be a necessity in the case of a donut-shaped annular dark field imager 16, for example; in such an imager, a central hole would allow beam passage when the imager was not in use).

As an alternative to imaging using camera 14 or imager 16, one can also invoke spectroscopic apparatus 18, which could be an EELS module, for example (EELS=Electron Energy-Loss Spectroscopy).

It should be noted that the order/location of items 14, 16 and 18 is not strict, and many possible variations are conceivable. For example, spectroscopic apparatus 18 can also be integrated into the imaging system 8.

Note that the controller (computer processor) E is connected to various illustrated components via control lines (buses) E'. This controller E can provide a variety of functions, such as synchronizing actions, providing setpoints, processing signals, performing calculations, and displaying messages/information on a display device (not depicted). Needless to say, the (schematically depicted) controller E may be (partially) inside or outside the enclosure V, and may have a unitary or composite structure, as desired. The skilled artisan will understand that the interior of the enclosure V does not have to be kept at a strict vacuum; for example, in a so-called "Environmental TEM/STEM", a background atmosphere of a given gas is deliberately introduced/maintained within the enclosure V. The skilled artisan will also understand that, in practice, it may be advantageous to confine the volume of enclosure V so that, where possible, it essentially hugs the axis O, taking the form of a small tube (e.g. of the order of 1 cm in diameter) through which the employed electron beam passes, but widening out to accommodate structures such as the source 2, specimen holder H, screen 10, camera 14, imager 16, spectroscopic apparatus 18, etc.

Figure 3:
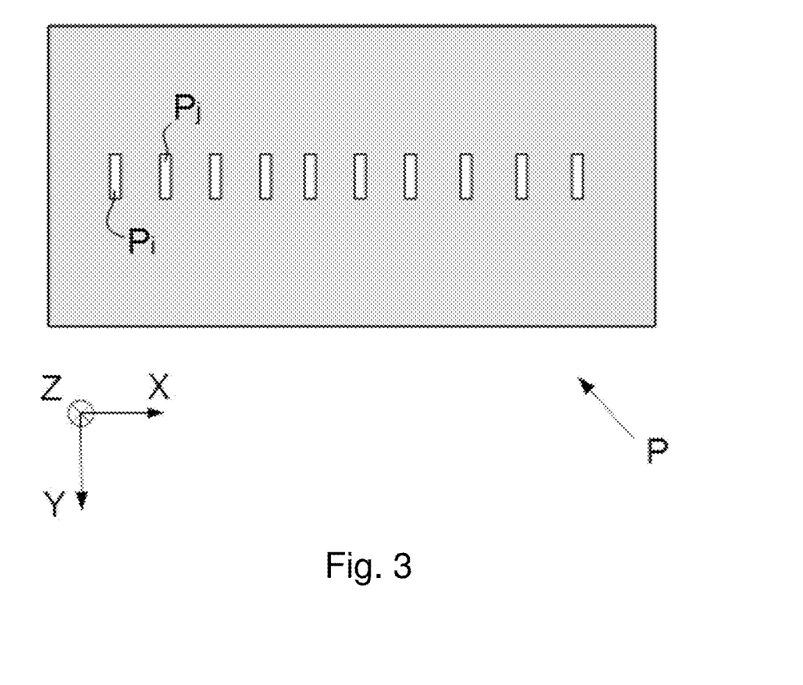
FIG. 3 renders a plan view of part of the subject of FIG. 2.

In the specific context of the current invention, the following items are present in the depicted set-up, more specifically in the illuminator 4 (see FIGS. 2 and 3 also):

A beam deflecting device D, such as an RF resonant cavity;

An aperture plate P comprising an array of apertures.

In this particular instance, the following non-limiting choices have been made:

The Z position of the deflecting device D along the optical axis O is chosen so as to image D onto specimen S;

The aperture plate P is situated at a beam crossover point between D and S;

The source 2 produces a pulsed beam, e.g. with a pulse frequency of 1 MHz.

In operation, the deflecting device D can be invoked to laterally deflect entrant beam C within the XY plane, whereby beam C can be caused to scan across the aperture array of aperture plate P (see FIG. 3), thereby alternatingly interrupting and transmitting the beam C so as to produce a train T of beam pulses (see FIG. 2) on the downstream side of plate P. This train T of pulses will have a longitudinal dimensional component/extent parallel to Z (the nominal propagation direction of particles in beam C) and a lateral dimensional component/extent parallel to the XY plane (parallel to the direction of the scanned aperture array in plate P). The beam C' that emerges from illuminator 4 will comprise this pulse train T, and will irradiate specimen S therewith. Correspondingly, the transmitted electron flux C" that emerges from specimen S as a result of this irradiation will be characterized by (a manipulated manifestation of) pulse train T, and will "imprint" the detector 14 (for example) herewith. As already set forth above, the employed detector can be used to examine different "detection entities"—such as diffraction patterns, spectra and/or imagery—any of which can be detected as a time-resolved series/sequence of (spatially displaced) sub-entities (components) due to the nature of the pulse train T with which they are generated; in this context, a specific example of a detection entity (diffraction pattern) will be discussed below in the context of FIG. 4.

Turning now specifically to FIG. 2, this shows important aspects of FIG. 1 in more detail. In particular, items D and P are positioned between condenser lens 41 and upper objective lens 42 (in many TEM designs, the last lens element of the illuminator 4 can be regarded as the first lens element of the projection system 8, so that the specimen S can be regarded as sitting partially within the projection system 8). Also shown is (a so-called diffraction lens of) the (rest of) projection system 8. In the figure, the solid rays $R_S$ illustrate how the nominal/un-deflected beam gets collimated onto the specimen S, and focused onto the detector 14, and the dashed rays $R_D$ illustrate how the deflector D is imaged onto the detector 14, with an intermediate crossover $R_D'$. Of particular interest is a short segment $C_T$ of the entrant beam C, which (in accordance with the invention) is going to be deflected/scanned across aperture plate P by deflecting device D, and will thereby be converted (chopped up) into pulse train T. In this context, FIG. 3 shows a plan view of aperture plate P—which, in this specific case, comprises a rectilinear array of slit-shaped apertures extending substantially parallel to the X axis (the intended deflection/scan direction of beam C across the plate P). Two of these apertures $P_i$ and $P_j$ are labelled. The apertures may, for example, have a width in the range 12-20 μm, and extend (parallel to X) over a distance of ca. 15 mm—though many other values are conceivable. In traversing these apertures, the beam segment $C_T$ is alternatingly interrupted (by the plate material between apertures) and transmitted (by successive apertures) so as to produce the pulse train T; for example, pulse $T_i$ in train T is produced by passage through aperture $P_i$, and pulse $T_j$ in train T is produced by passage through aperture $P_j$, etc.

EMBODIMENT 2

Figure 4:
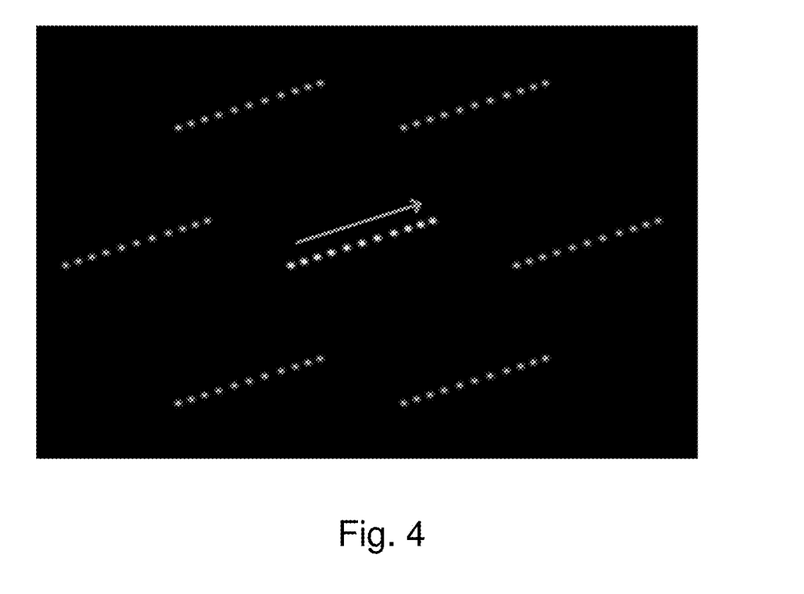
FIG. 4 shows an exemplary diffractogram detection result obtained using an embodiment of the present invention.

Turning attention now to FIG. 4, this illustrates an example of a detection entity (in this case, a diffraction pattern) captured using an embodiment of the present invention. More specifically, the Figure shows the lowest orders of a Si diffraction pattern—whereby the individual diffraction spots that would be obtained using a conventional technique are replaced by series (trains) of spatially displaced (temporally discriminated; positionally resolved) component spots. The arrow in the Figure indicates the direction of the beam deflection/scan (see FIGS. 2, 3). Individual spots in each series have ~1 ps time resolution and are separated by ~10 ps steps.

The invention claimed is:

1. A method of using a Charged Particle Microscope, comprising:
   a specimen holder, for holding a specimen;
   a source, for producing an irradiating beam of charged particles;
   an illuminator, for directing said beam so as to irradiate the specimen; and
   a detector, for detecting a flux of emergent radiation emanating from the specimen in response to said irradiation,
   the method comprising:
   in said illuminator, providing an aperture plate comprising an array of apertures;
   using a deflecting device to scan said beam across said array, thereby alternatingly interrupting and transmitting the beam so as to produce a train of beam pulses; and
   irradiating said specimen with said train of pulses, and using said detector to perform positionally resolved detection of the attendant emergent radiation.

2. A method according to claim 1, wherein said deflecting device comprises a resonant RF cavity through which the beam passes.

3. A method according to claim 2, wherein said cavity is excited in $TM_{110}$ mode.

4. A method according to claim 1, wherein, prior to entering said deflecting device, said beam is pulsed.

5. A method according to claim 1, wherein a plane of said deflecting device is imaged onto a plane of said specimen.

6. A method according to claim 1, wherein said aperture plate is located at an intermediate beam crossover point between said deflecting device and said specimen.

7. A method according to claim 1, wherein, in said train of pulses, successive pulses have a separation in the range 1-100 picoseconds.

8. A method according to claim 1, wherein said detector is used to register a time-resolved series of diffraction patterns generated by said specimen.

9. A method according to claim 2, wherein, prior to entering said deflecting device, said beam is pulsed.

10. A method according to claim 3, wherein, prior to entering said deflecting device, said beam is pulsed.

11. A method according to claim 2, wherein a plane of said deflecting device is imaged onto a plane of said specimen.

12. A method according to claim 3, wherein a plane of said deflecting device is imaged onto a plane of said specimen.

13. A method according to claim 4, wherein a plane of said deflecting device is imaged onto a plane of said specimen.

14. A method according to claim 2, wherein said aperture plate is located at an intermediate beam crossover point between said deflecting device and said specimen.

15. A method according to claim 3, wherein said aperture plate is located at an intermediate beam crossover point between said deflecting device and said specimen.

16. A method according to claim 2, wherein, in said train of pulses, successive pulses have a separation in the range 1-100 picoseconds.

17. A method according to claim 3, wherein, in said train of pulses, successive pulses have a separation in the range 1-100 picoseconds.

18. A method according to claim 2, wherein said detector is used to register a time-resolved series of diffraction patterns generated by said specimen.

19. A method according to claim 3, wherein said detector is used to register a time-resolved series of diffraction patterns generated by said specimen.

20. A Charged Particle Microscope, comprising:
a specimen holder, for holding a specimen;
a source, for producing an irradiating beam of charged particles;
an illuminator, for directing said beam so as to irradiate the specimen;
a detector, for detecting a flux of emergent radiation emanating from the specimen in response to said irradiation;
an electronic controller, for controlling aspects of the microscope's operation,
a beam deflecting device;
an aperture plate comprising an array of apertures, disposed in said illuminator, and in that said electronic controller is configured to:
drive said deflecting device so as to scan said beam across said array, thereby alternatingly interrupting and transmitting the beam so as to produce a train of beam pulses to irradiate said specimen; and
use said detector to perform positionally resolved detection of the attendant emergent radiation.

* * * * *